United States Patent [19]
Steinlechner

[11] Patent Number: 5,723,989
[45] Date of Patent: Mar. 3, 1998

[54] PHASE-MEASUREMENT DEVICE

[75] Inventor: Siegbert Steinlechner, Leonberg, Germany

[73] Assignee: Robert Bosch GmbH, Stuttgart, Germany

[21] Appl. No.: 648,064

[22] PCT Filed: Nov. 9, 1994

[86] PCT No.: PCT/DE94/01325

§ 371 Date: May 17, 1996

§ 102(e) Date: May 17, 1996

[87] PCT Pub. No.: WO95/14236

PCT Pub. Date: May 26, 1995

[30] Foreign Application Priority Data

Nov. 18, 1993 [DE] Germany .................. 43 39 303.9

[51] Int. Cl.⁶ .................. G01R 25/00; H03D 13/00
[52] U.S. Cl. .................. 327/3; 327/2
[58] Field of Search .................. 327/2–12

[56] References Cited

U.S. PATENT DOCUMENTS 4,484,291  11/1984  Schlösser .................. 327/12
5,019,786   5/1991  Fairley et al. .................. 327/3
5,128,624   7/1992  Hoshino et al. .................. 327/3

OTHER PUBLICATIONS

U. Tietze et al.: "Halbleiter-Schaltungstechnik". Springer-Verlag, 1989, pp. 956–967.

*Primary Examiner*—Toan Tran
*Attorney, Agent, or Firm*—Spencer & Frank

[57] ABSTRACT

A device for determining the phase difference between a first and a second digital input signal (S1, S2) is disclosed. In a first embodiment, a clock signal (CLOCK) is supplied as a first counting signal (18) to a first counter (16), which is reset by the appearance of a predetermined edge (31) of the first input signal (S1). This embodiment permits phase measurement values in the range between zero and 360° to be generated at a high measurement rate. In second and third embodiments, which are preferably connected and, if desired, combined with the first embodiment, second and third switching signals (FORWARD, BACK) are generated from the digital input signals (S1, S2) and are supplied to a forward-backward counter (20). The second and third embodiments are suited for determining phase differences between the two digital input signals (S1, S2) which are multiples of 360°. The device in accordance with the invention is particularly suited for evaluating the phase difference which occurs between the output signals from two photoelectric detectors used in a heterodyne interferometer.

15 Claims, 5 Drawing Sheets

PHASE-MEASUREMENT DEVICE

BACKGROUND OF THE INVENTION

The invention relates to a device for determining the phase difference between two digital input signals. Phase measurement devices are known from the technical manual of U. Tietze and Ch. Schenk "Semiconductor Circuit Technology" Springer, eds., 1989, Sections 27.4.1 to 27.4.4, pages 956 to 967. With the scanning holding members and the synchronous rectifier described in Sections 27.4.1 and 27.4.2, which are each employed as phase measurement devices, the connection between a phase shift and the output signal is non-linear. The proposals for circuitry contained in Sections 27.4.3. and 27.4.4 generate a digital signal of a known amplitude from analog input signals, which is filtered by means of an analog low-pass filter. The voltage which can be picked up at the output of the low-pass filter is a measurement for the phase shift. The circuit described in Chapter 27.4.4 permits the determination of phase differences which exceed values above 360°. With this circuit, too, the phase information is contained in the mean value of a digital signal and is provided by means of analog low-pass filtering.

SUMMARY OF THE INVENTION

It is the object of the invention to disclose a phase measurement device which allows a high rate of measuring.

The phase measurement device of the invention in accordance with a first embodiment makes possible the determination of the instantaneous phase difference between two input signals, which can be up to 360°. The frequency of the first input signal can differ considerably from the frequency of the second input signal. The resolution of the phase measurement can be selected by means of fixing the frequency of a clock signal to a predetermined multiple of the frequency of the first input signal.

The phase measurement device of the invention in accordance with another embodiment of the invention allows the determination of the phase difference between two input signals of multiples of 360°, wherein the frequency of the second input signal is higher than the frequency of the first input signal. The appearance of a preselected edge of the first input signal is first stored in a memory. When y≧2 preselected edges of the second input signal appear prior to the next preselected edge of the first input signal, y−1 switching signals are delivered to a counter, whose counter reading is considered to be the measurement of a multiple of 360° of the phase difference.

The phase measurement device of the invention in accordance with a further embodiment of the invention allows the determination of the phase difference between two input signals of multiples of 360°, wherein the frequency of the first input signal is higher than the frequency of the second input signal. At the appearance of a further x≧1 preselected edges of the first input signal prior to the next preselected edge of the second input signal, x switching signals are delivered to a counter. The counter reading is considered to be the measurement of a multiple of 360° of the phase difference.

All embodiments of phase measurement devices in accordance with the invention have the advantage that an actual measured value is available immediately after the completion of a period of the second input signal. The embodiments have in common that a respective counter of preselected edges of the two input signals is controlled in such a way that the counter reading is a measurement for the phase difference. A determination of the mean value is no longer necessary. The various embodiments of phase measurement devices in accordance with the invention provide accurate measured values, even with quite different frequencies of the two input signals.

An advantageous further development provides the combination of the second and third embodiment of the phase measurement device in accordance with the invention, which can be realized in a particularly simple manner if a forward-backward counter is employed as the counter. Forward or backward counting pulses are generated as a function of whether the frequency of the second input signal is higher or lower than the frequency of the first input signal. Therefore the counter reading represents the phase difference between the two input signals regardless of their frequency difference. Positive as well as negative phase shifts can be provided as multiples of 360°, depending on the design of the counter.

An advantageous design of the embodiment provides that the clock frequency is a multiple of the power of two of the first input signal. Selecting a power of two makes a simple technical circuit realization by means of a binary counter possible.

The phase measurement device in accordance with the invention is suitable for analog as well as digital input signals. Analog input signals can respectively be directed to a comparator which outputs a digital signal.

An increase in the measurement accuracy of the phase measurement in the range up to 360° is possible by means of forming a mean value, which provides an unambiguous result.

The phase measurement device in accordance with the invention is particularly suitable for evaluating phase differences of signals issued by photoelectric detectors employed in heterodyne interferometers. A high measurement rate is required in these applications if it is intended to obtain information regarding the movement of an object to be measured. The reference signal preferably is the first input signal, which has a known, fixedly preset frequency. The second input signal is the measurement signal affected by the object to be measured, which has a variable frequency during the movement of the object to be measured. The determination of phase differences in a measuring range of arbitrary multiples of 360° makes the detection of the movement of the object to be measured within a correspondingly large area possible.

BRIEF DESCRIPTION OF THE DRAWINGS

3A–3K the frequency of the second input signal is higher than that of the first input signal, and in FIGS. 4A–K the frequency of the second input signal is lower than that of the first input signal.

DESCRIPTION OF THE PREFERRED EMBODIMENT

Figure 1:
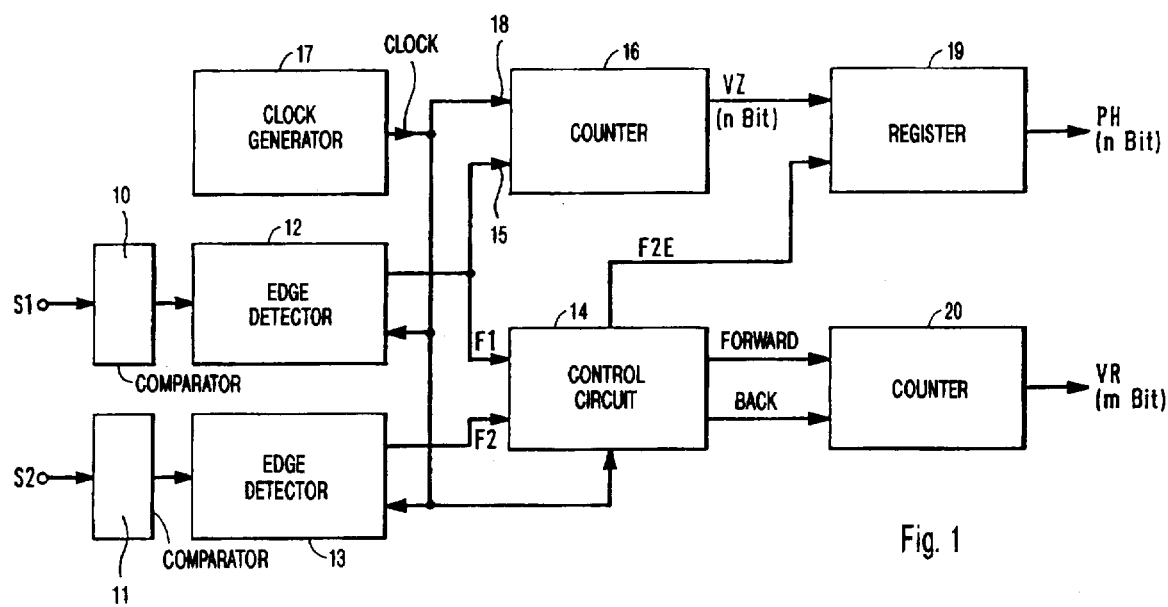
FIG. 1 shows a block diagram of a phase measurement device in accordance with the invention.

In FIG. 1, a first input signal S1 is supplied to a first comparator 10 and a second input signal S2 to a second comparator 11. The first comparator 10 passes a signal to a first edge detector 12 and the second comparator 11 provides a signal to a second edge detector 13. The first edge detector 12 supplies a first signal F1 to a control circuit 14. The first signal F1 simultaneously is a reset signal 15 for a first counter 16. The second edge detector 13 supplies a second signal F2 to the control circuit 14. A clock generator 17 is provided, which supplies a clock signal CLOCK to the first and second edge detectors 12, 13 and to the control circuit 14. The clock signal CLOCK is furthermore supplied as the first counting signal 18 to the first counter 16. The first counter 16 supplies a digital, n bit wide output signal VZ, which represents the counter reading, to a register 19, which is furthermore supplied with a control signal F2E issued by the control circuit 14. The register 19 makes a digital, n bit wide first number PH available at its output. The control circuit 14 furthermore issues a first switching signal FORWARD (shortened to FWD in some of the drawings) and a second switching signal BACK to an m bit wide counter 20, which makes a digital, m bit wide second number VR available at is output.

Figure 2:
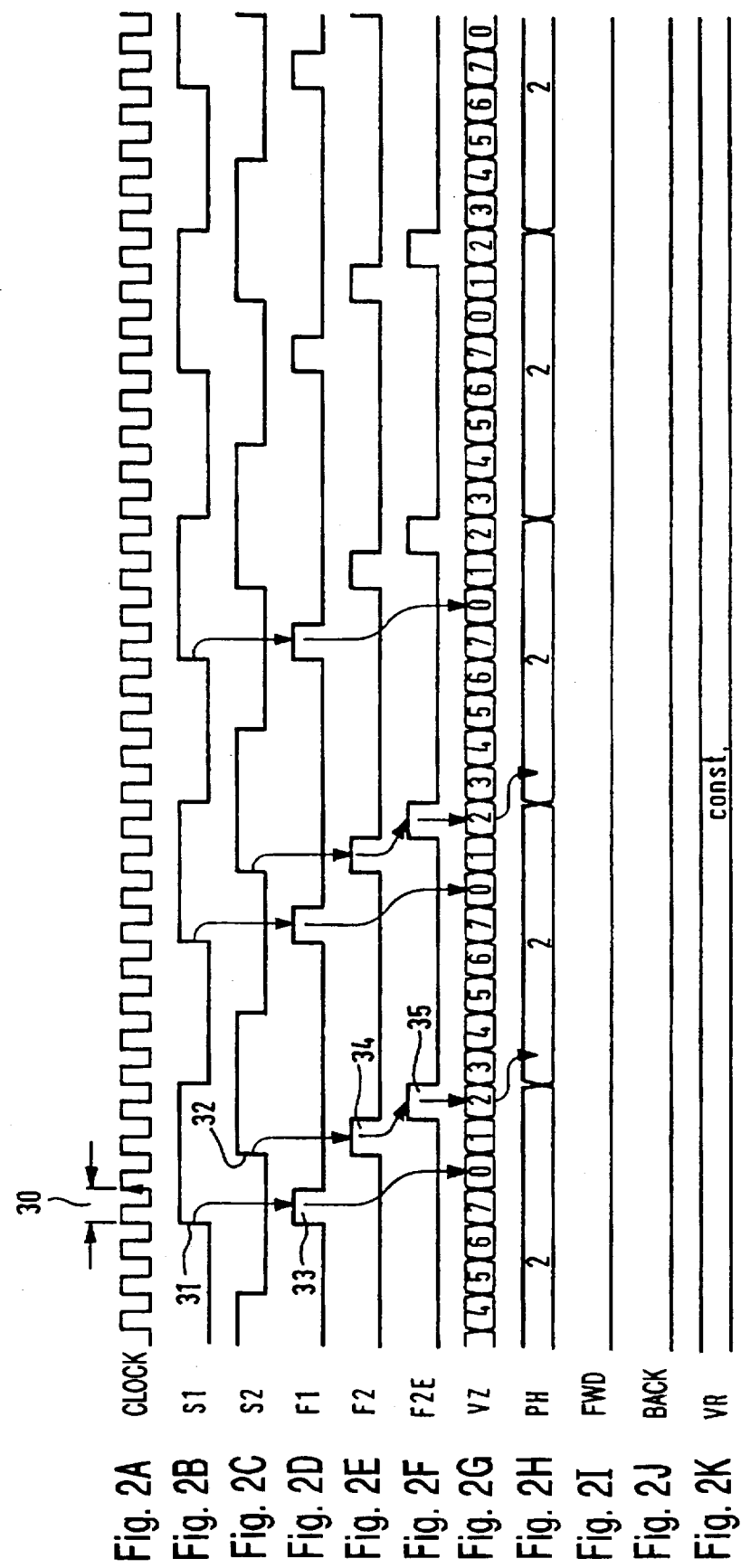
FIGS. 2A–2K, 3A–3K, and 4A–4K show pulses as a function of time, occurring in the device in accordance with FIG. 1, wherein the frequencies of two input signals are equal in FIGS. 2A–2K, in FIGS.
Figure 3:
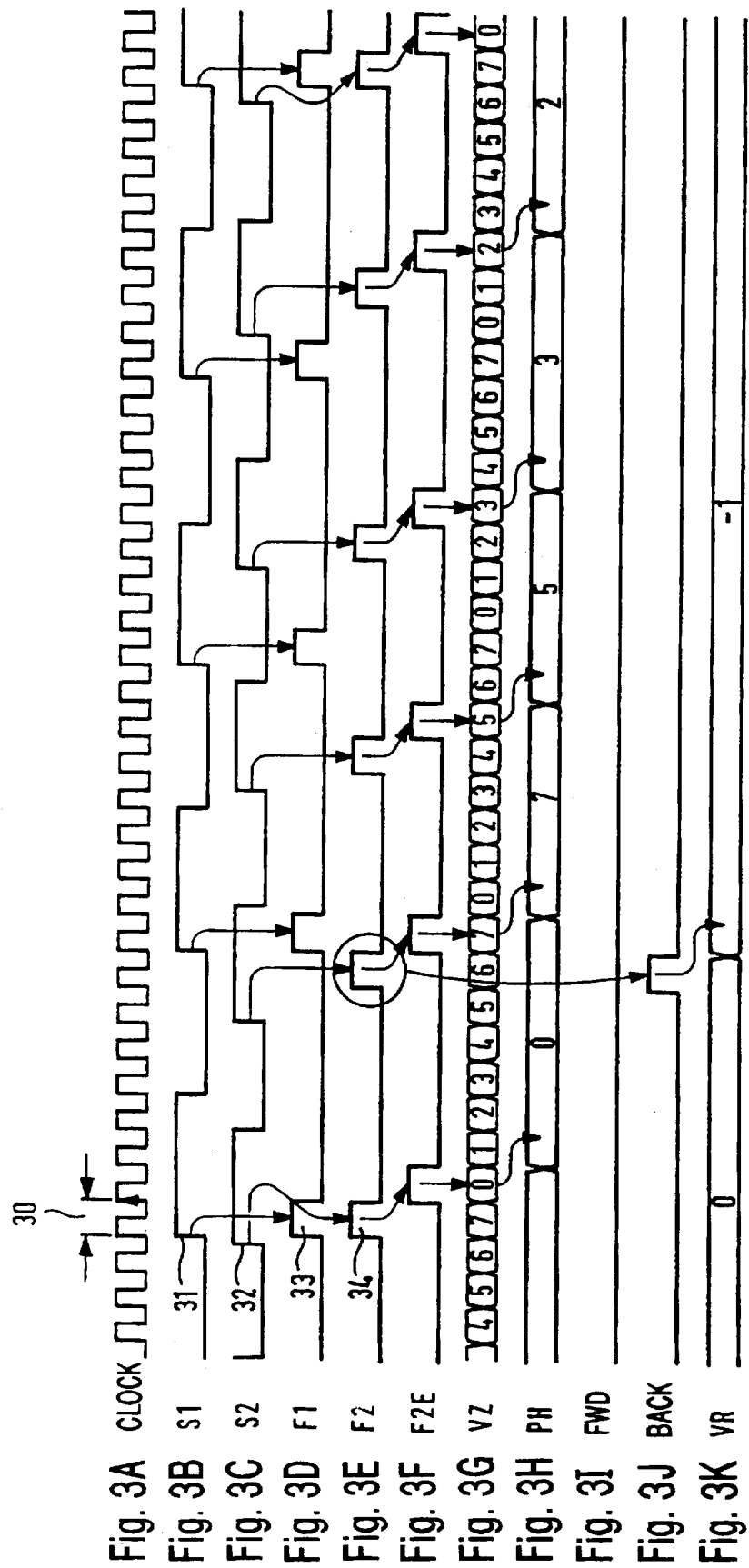
Figure 4:
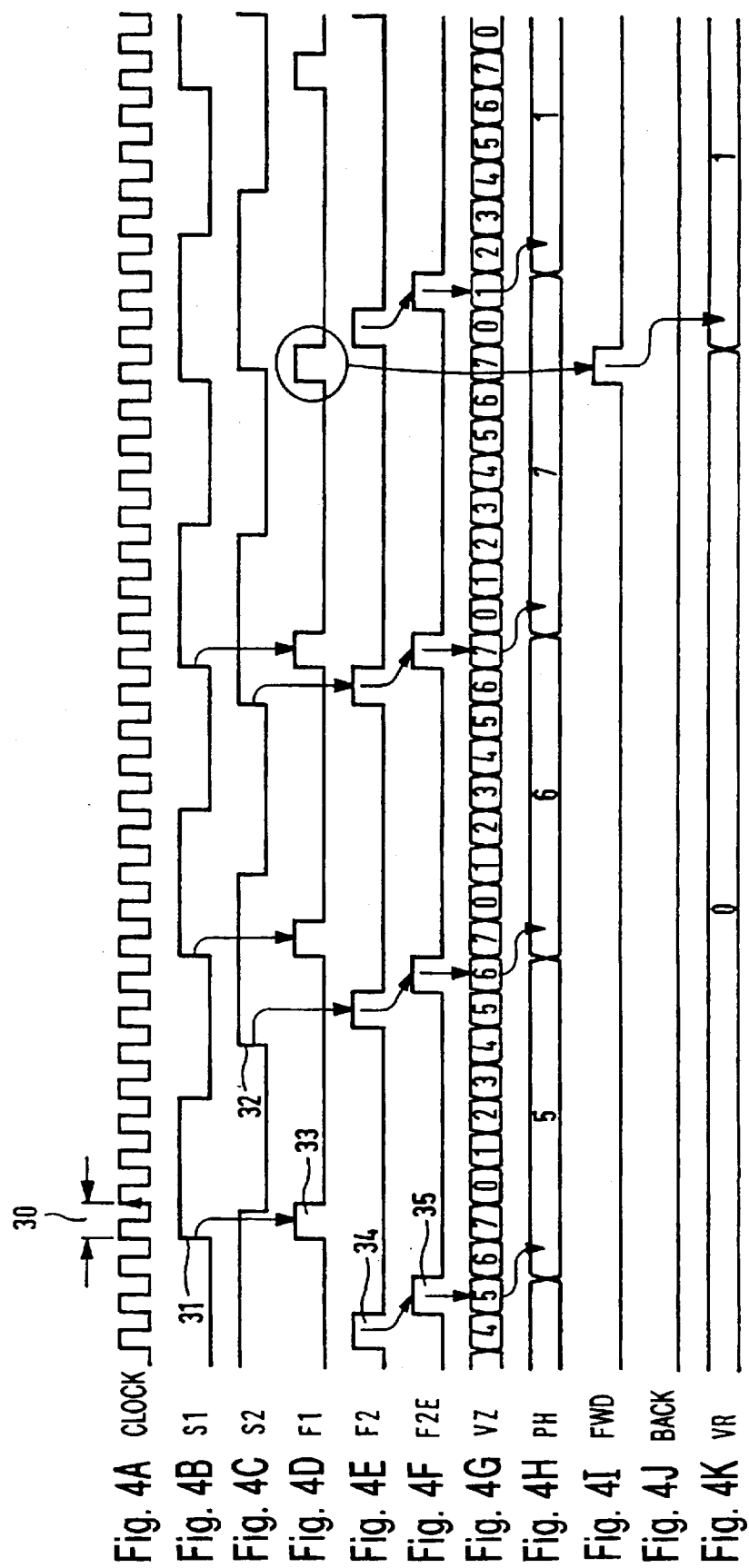

The mode of operation of the phase measurement device represented in FIG. 1 will be explained in detail by means of the signal sequences represented in FIGS. 2 to 4:

It is assumed in FIGS. 2A-2K, 3A-3K, and A-4K, which will occasionally be referred to hereafter as the signal sequence drawings that the input signals S1, S2 are present in digital form. In case the input signals S1, S2 are not digital signals, comparators 10, 11 can be provided which convert analog input signals S1, S2 to corresponding digital signals.

Arrows have been drawn in the signal sequence drawings which indicate which signals change as a function of levels or edges occurring in other signals.

Basically the two input signals S1, S2 do not have a chronological connection with the clock signals CLOCK. The two edge detectors 12, 13 make this chronological connection in order to be able to perform simple, clock signal-related synchronous signal processing. The two edge detectors 12, 13 are edge detectors controlled by the clock signal CLOCK which, following a preselected edge 31, 32 of the input signals S1, S2, respectively output a pulse 33, 34 of the length of a clock period 30 as the first and second signals F1, F2. It is assumed in the signal sequence drawings that the preselected edges 31, 32 are the respective positive or rising edges. Therefore the first signal F1 indicates for the length of a clock period 30 that a positive signal edge 31 of the first signal S1 has occurred, while in a corresponding manner the second signal F2 signals the occurrence of a positive flank 32 of the second input signal S2 for the length of a clock period 30.

A first embodiment of the device in accordance with the invention provides the determination of a phase difference between the two input signals S1, S2, which can be up to 360°.

The frequency of the clock signal CLOCK is intended to be a multiple of the frequency of the first input signal S1. The input signal S1 is intended to be the reference signal in connection with which the phase shift of the second input signal S2 is determined. The frequency of the first input signal S1 is often known in actual applications. However, as already mentioned, there is no phase relation with the clock signal CLOCK. It is assumed in what follows that a power of two is selected as the multiple. The advantage lies in that a binary counter of a width of n bits can be used as the first counter 16.

The first counter 16 is a synchronous, n bit wide forward counter, for example, which is respectively incremented in case of a positive edge of the first counting signal 18, which is identical with the clock signal CLOCK. The counter has the special feature that it stops when reaching the counter reading ($2^n-1$), even with the occurrence of further clock-signals CLOCK on the counter reading ($2^n-1$) (and does not move forward to the counter readings 0, 1, 2 . . . ).

The instantaneous counter reading is represented by the n bit wide output signal VZ of the first counter 16. Each positive signal edge 31 of the first input signal S1, indicated by pulses 33 of the first signal F1, triggers a resetting of the first counter 16 to a predetermined value, preferably the value zero. The reset signal 15 is identical with the first signal F1. The descending edges of the pulse 33, which occur synchronously with the next active (positive) edge of the clock signal CLOCK, are provided as the active edges of the first signal F1 which cause the reset process. Each active clock signal edge is indicated by an arrow.

The control signal F2E indicates at what time the n bit wide output signal VZ of the first counter 16 is valid. The control signal. F2E is generated in a clock-synchronous manner in the control circuit 14 in the simplest manner from the second signal F2 following the descending edges of the pulses 34. The control signal F2E is formed by pulses 35 which, for example, are of the length 30 of a clock period. The output signal VZ is valid during the length of the pulses 35. The negative or falling edge of the pulses 35 causes the transfer of the output signal VZ to the register 19, which stores the reading of the first counter 16 until the appearance of the next pulse of the control signal F2E.

The n bit wide first number PH is available at the output of the register 19 and can be interpreted as a positive integer number. The first number PH represents the instantaneous phase shift between the two input signals S1, S2, which can be located between zero degrees and 360°. The resolution is $360°/(2^n)$, wherein it is assumed in the signal sequence drawings that $2^n$ has the value of 8. Thus the frequency of the clock signal CLOCK is eight times as high as the frequency of the first input signal S1.

The case in which the frequencies of the two input signals S1, S2 are equal is shown in FIG. 2A-2K. The (constant) phase difference is assumed with the value of 2 of the first number PH to which an angle of 90° is assigned.

The cases wherein the frequencies of the two input signals S1, S2 are different are shown in FIGS. 3A-3K and 4A-4K. In FIGS. 3A-3K the frequency of the second input signal S2 is higher than that of the first input signal S1, and FIGS. 4A-4K show the reverse case. The phase difference changes continuously. It is particularly important that actual values of the phase shift are present following each predetermined edge 32 of the second input signal S2.

Clear phase measurements by multiples of 360° phase difference are possible in accordance with other embodiments of the phase measurement device in accordance with the invention which are preferably combined with the first embodiment. Essentially the two other embodiments contain the second counter 20, which is supplied with a first switching signal FORWARD or a second switching signal BACK as the second or third counting signal. The control circuit 14 generates the first and second switch signals FORWARD and BACK as a function of the first and second signals F1, F2. The second embodiment of the phase measurement device in accordance with the invention differs from the third embodiment in that the frequency of the second input signal S2 of the second embodiment is higher than that of the first input signal S1, while the conditions are reversed in the third embodiment. However, the second and the third embodiment can be particularly well combined in that the second counter 20 is designed as a forward-backward or up-down counter, wherein the first switching signal FORWARD is supplied to the second counter as the second counting signal, and the second switching signal BACK is supplied to the second counter 20 as the third counting signal.

Figure 5:
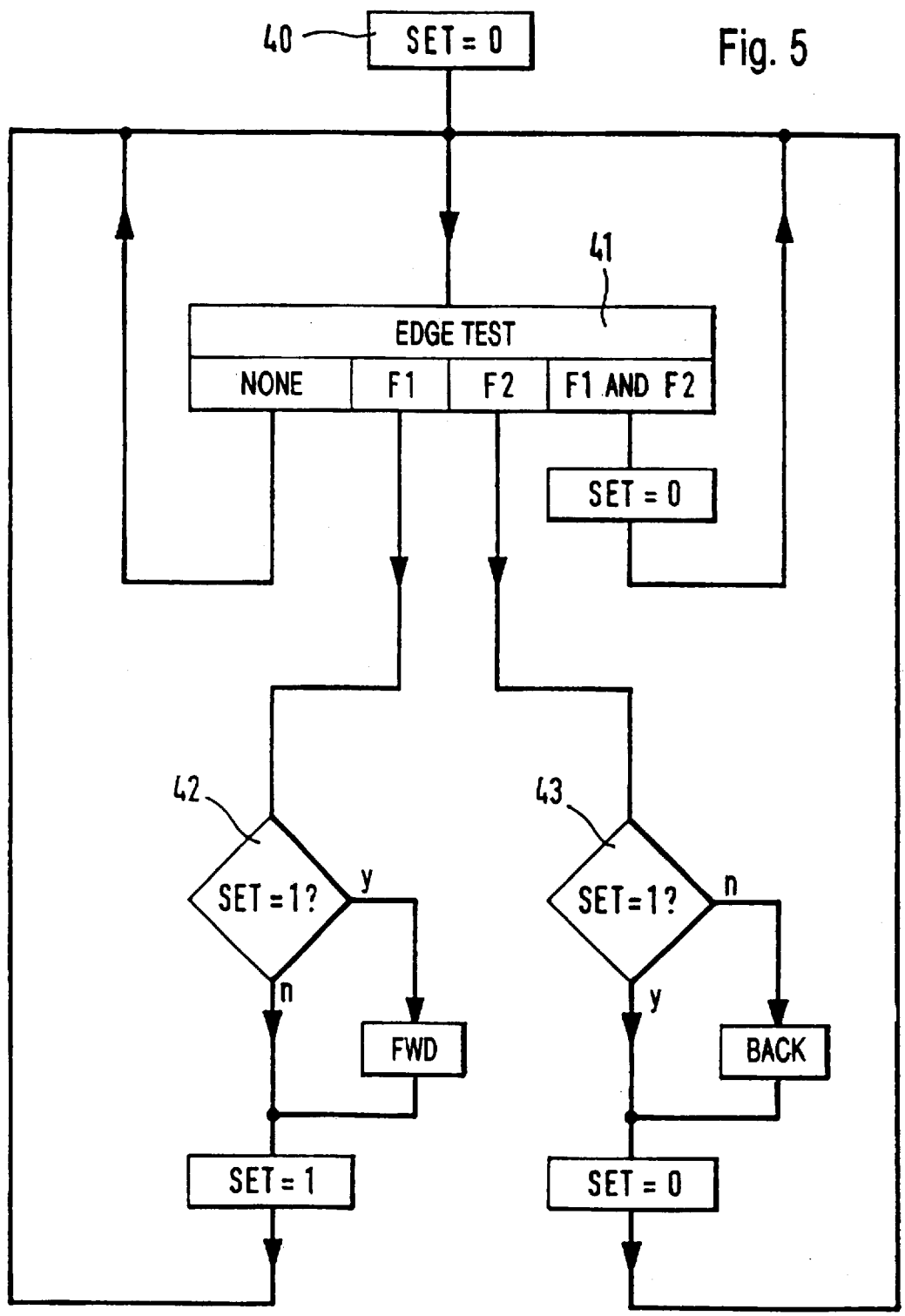
FIG. 5 shows a flow diagram of a method sequence occurring in the phase measurement device in accordance with the invention.

The manner in which the first and second switching signals FORWARD, BACK are made available by the control circuit 14 will be explained in detail with the help of the flow diagram represented in FIG. 5:

The process starts with an initialization 40, wherein an auxiliary value identified by SET is set to zero. The auxiliary value SET is the contents of a memory, for example, which is changed at the appearance of predetermined edges 31, 32 of the input signals S1, S2, or—in accordance with the examples with clock-synchronous signal processing represented in the signal sequence drawings—at the appearance of pulses 33, 34 of the first and/or second signal F1, F2. An edge test 41 follows initialization 40. If the trivial case occurs that no pulse 33, 34 corresponding to an edge 31, 32 was detected, the edge test 41 is again performed. If the appearance of the pulse 33 of the first signal F1, corresponding to the predetermined edge 31 of the first input signal S1, is detected during the edge test 41, it is determined in a first check 42 whether the auxiliary value SET=1. If this is not the case, the auxiliary value SET is assigned the value 1 and an edge test 41 is again performed thereafter. If, however, in the first check 42 it is determined that the auxiliary value SET=1, the second switching signal FORWARD is generated by the control circuit 14, which is supplied to the second counter 20 as the third counting signal.

The appearance of the first switching signal FORWARD corresponds to the case represented in FIGS. 4A-4K, wherein the frequency of the first input signal S1 is higher than the frequency of the second input signal S2. The m bit wide second number VR at the output of the second counter 20 is increased by 1 in the process. The increase by 1 means that a phase advance of 360° of the first input signal S1 in respect to the second input signal S2 has occurred.

If the appearance of the pulse 34 of the second signal F2, which corresponds to the predetermined edge 32 of the second input signal S2, is detected in the edge test 41, it is determined in a second check 43 whether the auxiliary value SET has the value 1. If this is correct, the auxiliary value SET is subsequently set to zero and the edge test 41 is again performed thereafter. If it is determined in the second check 43 that the auxiliary value SET has the value zero, the control circuit 14 generates the first switching signal BACK, which is supplied to the second counter 20 as the second counting signal. This case is represented in FIGS. 3A-3K, wherein the frequency of the first input signal S1 is lower than the frequency of the second input signal S2. The m bit wide number VR at the output of the second counter 20 is reduced by 1 by the second switching signal BACK. The reduction by 1 represents a phase trailing by 360° of the first input signal S1 in respect to the second input signal S2.

It will be apparent from the above that one of the embodiments of the invention allows a determination of the phase difference between two input signals in multiples of 360°, wherein the frequency of the second input signal S2 is higher than the frequency of the first input signal S1. The appearance of a preselected edge 31 of the first input signal S1 is first stored. When a number $y \geq 2$ preselected edges 32 of the second input signal S2 appear prior to the next preselected edge 31 of the first input signal S1, y−1 switching signals BACK are delivered to counter 20, whose counter reading is considered to be the measurement of a multiple of 360° of the phase difference. It will also be apparent that a further embodiment of the invention allows a determination of the phase difference between two input signals in multiples of 360°, wherein the frequency of the first input signal S1 is higher than the frequency of the second input signal S2. At the appearance of a further $x \geq 1$ preselected edges 31 of the first input signal S1 prior to the next preselected edge 32 of the second input signal S2, x switching signals FORWARD are delivered to the counter 20. The counter reading is considered to be the measurement of a multiple of 360° of the phase difference, wherein x and y are integers.

In the course of the performance of the edge test 41 it is possible for the case to occur that the pulses 33, 34 of the two signals F1, F2 appear simultaneously. If, instead of the two signals F1, F2, the two digital input signals S1, S2 are directly checked for the appearance of predetermined edges 31, 32, this case seldom occurs. In this case the simultaneous appearance of the predetermined signal edges 31, 32 would depend on the subsequent signal processing which has only a limited operating speed. This special case occurs more often when utilizing the two signals F1, F2 which are synchronized with the clock signal CLOCK. The probability for their appearance depends on the amount of the whole number multiples by which the frequency of the clock signal CLOCK is higher than the frequency of the first input signal F1. In the cases illustrated in the signal sequence drawings, in which $2^n$ has the value of 8, the probability of the simultaneous appearance of the two signals F1, F2 is 1/8. This special case is represented in FIGS. 2A–2K. Neither a first nor a second switching signal FORWARD, BACK is generated by the control circuit 14. After this state of affairs has been detected in the edge test 41, another edge test 41 is performed, wherein the auxiliary value SET is set to zero. The second counter 20 maintains the counter reading it has reached without change.

As with the first embodiment, in connection with the other embodiments of the phase measurement device in accordance with the invention it is also particularly advantageous that an actual value is present the moment a phase difference of 360° is exceeded.

A single number VZ.PH, which is (m+n) bits wide, is obtained by combining the m bit wide second number VZ with the n bit wide first number PH, which represents the complete phase measurement value. If the ratio of the frequencies of the clock signal CLOCK and the first input signal S1 is a power of two, the (m=n) bit wide number VZ.PH can be directly interpreted as being a power of two complementary number with m places ahead of the decimal and n places after the decimal, which represents the phase difference in units of 360 degrees.

With a possibly reduced measurement rate, several phase measurement values VZ.PH can be added and subsequently divided by the number of measurement values to increase the measuring accuracy.

The number of the phase measurement values to be averaged is preferably a power of two. The division by this power of two can then be performed by a simple displacement to the right by the corresponding number of places of a binary word representing the mean result.

I claim:

1. A device for determining a phase difference between a first digital signal having rising and falling edges and a second digital input signal having rising and falling edges, either the rising or falling edges of the first input signal being selected as predetermined edges of the first input signal and either the rising or falling edges of the second input signal being selected as predetermined edges of the second input signal, said device comprising:

- a clock generator (17) which emits a clock signal (CLOCK), whose frequency is a whole number multiple of the frequency of the first input signal (S1),
- a first counter (16) which receives the clock signal (CLOCK) as a counting signal (18),
- means (12) for resetting the first counter (16) each time the predetermined edge (31) of the first input signal (S1) appears,
- a second counter (20), the second counter (20) being a forward/backward counter,
- means (12, 13, 14) for generating first switching signals (FORWARD) which are supplied to the second counter (20) to count the second counter (20) forward and second Switching signals (BACK) which are supplied to the second counter (20) to count the second counter (20) backward, the first switching signals (FORWARD) being generated such that, at the appearance of a predetermined edge (31) of the first input signal (S1) and the further appearance of a number $x \geq 1$ predetermined edges (31) of the first input signal (S1) prior to a subsequent predetermined edge (32) of the second input signal (S2), x first switching signals (FORWARD) are supplied to the second counter (20) and the second switching signals (BACK) being generated such that, at the appearance of a predetermined edge (31) of the first input signal (S1) and the further appearance of a number $y \geq 2$ predetermined edges (32) of the second input signal (S2), prior to the subsequent predetermined edge (31) of the first input signal (S1), y−1 second switching signals (BACK) are supplied to the second counter (20), wherein x and y are integers,
- wherein the content of the first counter (16) provides a measure of the phase difference in a range between 0° to 360° when the predetermined edges (32) of the second input signal (S2) appears, and the content of the second counter (20) provides a measure of the phase difference in a multiple of 360°.

2. A device in accordance with claim 1, wherein the frequency of the clock signal (CLOCK) is set to a multiple of a power of two of the frequency of the first input signal (S1).

3. A device in accordance with claim 1, in combination with comparators (10, 11) which form the first and second signals (S1, S2) from analog input signals.

4. A device in accordance with claim 1, further comprising means for forming a mean value of the content of at least one of the first and second counters (16, 20).

5. A device in accordance with claim 1, wherein the first counter (16) comprises an n bit wide forward counter.

6. A device in accordance with claim 5, wherein, when the first counter (16) has reached a predetermined counter reading ($2^n-1$), the first counter (16) stops at the predetermined counter reading ($2^n-1$), even if further clock signals (CLOCK) appear.

7. A device in accordance with claim 1, in combination with a heterodyne interferometer having two photoelectric detectors, wherein the two input signals (S1, S2) are the output signals of said photoelectric detectors.

8. A device for determining a phase difference between a first digital input signal having rising and falling edges and a second digital input signal having rising and falling edges, either the rising or falling edges of the first input signal being selected as predetermined edges of the first input signal and either the rising or falling edges of the second input signal being selected as predetermined edges of the second input signal, said device comprising:

- first means for determining a component of the phase difference between the first and the second input signals that is less than 360°, the first means including a clock generator which emits a clock signal and a first counter which counts the clock signal, the first counter being reset whenever the rising edge of the first input signal appears; and
- second means for determining a component of the phase difference between the first and second input signals that is an integer multiple of 360°, the second means including means for counting how many times the predetermined edge of one of the first and second input signals appears between consecutive appearances of the predetermined edge of the other of the first and second input signals.

9. A device according to claim 8, wherein the first means further comprises a register which stores the content of the first counter whenever the predetermined edge of the second input signal appears.

10. A device according to claim 8, wherein the clock signal has a frequency which is an integral multiple of the frequency of the first input signal.

11. A device according to claim 10, wherein the integral multiple of the frequency of the first input signal is a power of 2.

12. A device according to claim 8, wherein the means for counting comprises a forward/backward counter.

13. A device according to claim 12, wherein the second means further comprises means for testing to determine if the predetermined edge of either of the first and second input signals but not both has appeared during a predetermined interval.

14. A device according to claim 13, wherein the second means further comprises means for checking a stored value if the predetermined edge of one of the first and second input signals has appeared during the predetermined interval, the stored value having one of two states, and for then either changing the state of the stored value or emitting a counting signal to the forward/backward counter.

15. A device according to claim 8, wherein the second means comprises means for testing to determine if the predetermined edge of at least one of the first and second input signals has appeared during a predetermined interval.

* * * * *